(12) United States Patent
Gabelich

(10) Patent No.: US 8,167,057 B2
(45) Date of Patent: May 1, 2012

(54) INTRUSION RESISTANT APPARATUS AND METHOD

(75) Inventor: Stephen A. Gabelich, San Pedro, CA (US)

(73) Assignee: Raytheon Company, Waltham, MA (US)

( * ) Notice: Subject to any disclaimer, the term of this patent is extended or adjusted under 35 U.S.C. 154(b) by 970 days.

(21) Appl. No.: 12/136,634

(22) Filed: Jun. 10, 2008

(65) Prior Publication Data

US 2008/0273376 A1 Nov. 6, 2008

Related U.S. Application Data

(62) Division of application No. 11/446,534, filed on Jun. 2, 2006, now abandoned.

(51) Int. Cl.
G06F 12/14 (2006.01)
(52) U.S. Cl. ....................................................... 173/194
(58) Field of Classification Search .................... 713/194
See application file for complete search history.

(56) References Cited

U.S. PATENT DOCUMENTS

| | | | | |
|---|---|---|---|---|
| 3,742,471 A * | 6/1973 | Mikami | | 365/1 |
| 4,150,440 A * | 4/1979 | Bonnie et al. | | 365/2 |
| 5,159,513 A | 10/1992 | Dieny et al. | | |
| 5,701,221 A * | 12/1997 | Taniyama et al. | | 360/327.3 |
| 5,743,662 A * | 4/1998 | Abumehdi et al. | | 400/62 |
| 5,800,935 A * | 9/1998 | Ishi | | 428/815 |
| 5,949,707 A | 9/1999 | Pohm et al. | | |
| 6,021,065 A | 2/2000 | Daughton et al. | | |
| 6,414,884 B1 | 7/2002 | DeFelice et al. | | |
| 6,760,841 B1 * | 7/2004 | Fernandez | | 713/172 |
| 6,774,807 B1 | 8/2004 | Lehfeldt et al. | | |
| 7,005,733 B2 | 2/2006 | Komerling et al. | | |
| 7,224,634 B2 | 5/2007 | Lenssen et al. | | |
| 7,468,664 B2 * | 12/2008 | Daughton et al. | | 340/551 |
| 2002/0037079 A1 * | 3/2002 | Duval | | 380/37 |
| 2002/0070653 A1 * | 6/2002 | Kodama et al. | | 313/402 |
| 2003/0133234 A1 * | 7/2003 | Furukawa et al. | | 360/324.12 |
| 2003/0167395 A1 * | 9/2003 | Chang et al. | | 713/183 |
| 2006/0081497 A1 * | 4/2006 | Knudsen | | 206/701 |
| 2006/0146597 A1 | 7/2006 | Lenssen et al. | | |
| 2006/0179490 A1 | 8/2006 | Lenssen et al. | | |
| 2007/0172053 A1 * | 7/2007 | Poirier | | 380/28 |

OTHER PUBLICATIONS

U.S. Appl. No. 60/434,520, filed Dec. 2002, Carl John Knudsen.

* cited by examiner

*Primary Examiner* — Peter Poltorak
(74) *Attorney, Agent, or Firm* — Schwegman, Lundberg & Woessner, P.A.

(57) ABSTRACT

An intrusion-resistant apparatus may include a magnetic memory array disposed with an enclosure. The magnetic memory may include a plurality of magnetic memory elements, each adapted to store a binary value only in the presence of a predetermined bias magnetic field having a magnetic field strength and direction within predetermined limits. Means for providing the predetermined bias magnetic field and an encryption/decryption engine may be disposed within the enclosure. An encryption/decryption key may be stored in the magnetic memory array. The encryption/decryption key may be used by the encryption/decryption engine to encrypt and decrypt data.

17 Claims, 4 Drawing Sheets

INTRUSION RESISTANT APPARATUS AND METHOD

RELATED APPLICATION INFORMATION

This application is a division of application Ser. No. 11/446,534, entitled "Intrusion Detection Apparatus and Method", filed Jun. 2, 2006.

GOVERNMENT INTERESTS

This invention was made with government support. The government has certain rights in this invention.

BACKGROUND

1. Field

This disclosure relates to an apparatus to detect hardware intrusion into a protected enclosure without requiring electrical power.

2. Description of the Related Art

There are numerous applications where it is desirable to be able to detect intrusion into a protected enclosure. The "intrusion" could be unauthorized opening, disassembly, or other attempt to gain access to the protected enclosure. The protected enclosure could contain, for example, proprietary hardware, security equipment, or fee collection or metering equipment. To provide protection to portable equipment or equipment without applied power (such as during storage or shipment), the intrusion detection means must also operate without electrical power. Thus there is a need for a cost-effective, reliable, digitally-compatible, non-reversible sensor that can detect intrusion without the need for battery or other electrical power. This invention satisfies all of these requirements.

SUMMARY OF THE INVENTION

A first embodiment of the invention consists of an array of at least two magnetic memory elements, each of which has two electronically-readable stable states in the presence of a bias magnetic field, and a means for providing the required bias magnetic field. The term "bias magnetic field" is intended to describe a magnetic field having a strength and direction within predetermined limits that will sustain the states of the magnetic memory elements. The predetermined limits on field strength may be centered about some finite value or may be centered about zero. In the latter case, the magnetic memory elements are configured to maintain two stable states in the absence of an applied magnetic field, and to change states if the applied magnetic field exceeds some threshold value.

The magnetic memory elements and the means for providing the bias magnetic field are both located within a protected electronics enclosure and disposed such that any attempt to disassemble the enclosure will cause a change in the bias magnetic field and resultant permanent change to the content stored in the magnetic memory.

Intrusion detection functionality is initialized by electronically writing a binary code into the magnetic memory after the protected volume is completely assembled. Subsequent disassembly will automatically cause the initialization code to erase. Attempted intrusion can be detected by comparing the memory content with the known value of the code at initialization. The reaction to the detected intrusion may be an alarm or alert, or a reaction (such as erasing data or software) causing the protected equipment to lose functionality.

In a preferred embodiment, the binary code stored in the magnetic memory at initialization is used as the key to encrypt or decrypt stored data or communications. In this case, loss of the encryption code due to attempted intrusion is sufficient to cause the protected equipment to lose functionality.

In a preferred embodiment of the invention, the magnetic memory is an array of spin-valve magnetoresistive sensor elements. Spin-valve sensors are described in U.S. Pat. No. 5,159,513 and have been extensively developed for use in read heads for magnetic disc memory devices In the case where a finite bias magnetic field is required to maintain the memory states, the means for providing the bias magnetic field will preferably be a small permanent magnet. The magnetic memory and the magnet must be mounted within the protected enclosure such that they physically move with respect to each other (in any direction) if the enclosure is non-destructively disassembled In the case where the magnetic memory is configured to maintain stable states in the absence of an applied magnetic field (i.e., the bias field strength limits are centered on zero), the protected enclosure is designed to shield the magnetic memory array from external or ambient magnetic fields. Disassembly causes the magnetic memory to be exposed to magnetic fields (e.g., the earth's magnetic field), resulting in changes to the memory content.

DETAILED DESCRIPTION

Description of Apparatus

Figure 1:
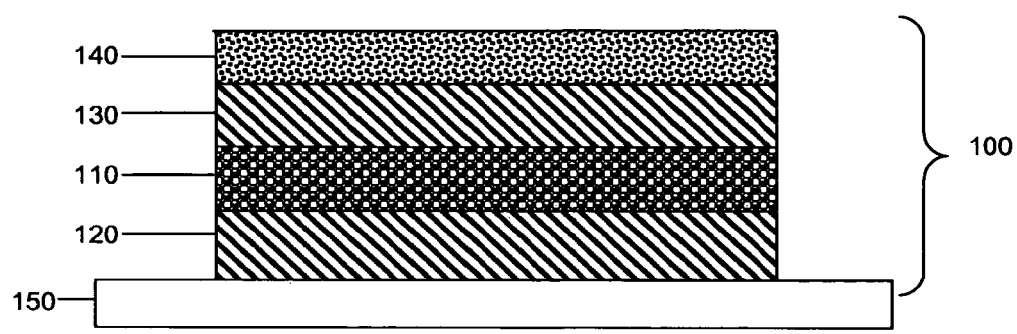
FIG. 1 is a schematic cross-sectional view of a prior art spin-valve magnetic sensor

FIG. 1 is a schematic cross-sectional view of an exemplary prior art spin-valve magnetic sensor suitable for use in the present invention. The magnetic sensor 100 is comprised of a number of layers deposited onto a substrate 150. Two thin film magnetic layers 120, 130 are separated by a non-magnetic layer 110. In the traditional spin-valve device, the non-magnetic layer 110 is a metal such as copper. A similar magnetic sensor, commonly called a spin-tunneling device, is known to employ a dielectric layer 110 between the magnetic layers 120, 130. An additional layer of antiferromagnetic material 140 is deposited directly in contact with one of the magnetic layers. All of these layers are physically very thin and may be only a few 10's of angstroms in thickness.

It must be understood that the device illustrated in FIG. 1 is an example of a sensor suitable for use in the invention. The asymmetric layer structure of this example device is typical of spin-valve devices configured for use with a non-zero bias magnetic field. Alternative magnetic sensor constructions are known, including an inverted device wherein the antiferromagnetic material is disposed between the lower magnetic film and the substrate. The use of additional magnetic or antiferromagnetic layers, deposited over or along side of the spin-valve device, is a known technique to tailor the characteristics of the spin valve. The characteristics of such devices may be tailored to include stable memory function with zero bias magnetic field.

The effect of the antiferromagnetic layer 140 is to "pin" the adjacent magnetic layer 130 such that the magnetization of layer 130 does not change in the presence of magnetic field (up to very high levels; thousands of Gauss), but instead always points in one direction along the long axis of the spin-valve device The other magnetic layer 120, called the "free" layer, is not pinned, and the direction of magnetization of layer 120 can vary in the presence of a magnetic field. However, layer 120 will exhibit a natural tendency to become magnetized in either of two stable states with the direction of magnetization either parallel to and antiparallel to that of the "pinned" layer 130.

The relative magnetization of the two magnetic layers 120, 130 with respect to each other determines the resistance of the nonmagnetic layer 110. When the magnetization of the free layer 120 points in the same direction as that of the pinned layer 130, the electrical resistance of layer 110 is reduced. Conversely, when the magnetization of layers 120, 130 are pointing in opposite directions, the electrical resistance of layer 110 is increased. Thus, in general, two stable resistance states are possible.

The degree of resistance change between states depends on the type of magnetic sensor and design parameters such as layer thicknesses. Spin-valve sensor devices typically exhibit a resistance change of approximately 5%, measured along the long axis of the nonmagnetic film 110. Spin-tunneling devices are reported to exhibit resistance changes greater than 40%, measured across the thickness of the nonmagnetic film 110

Figure 2:
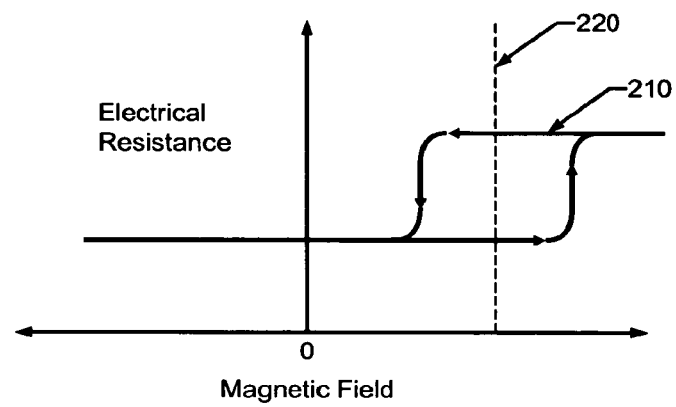
FIG. 2 is a diagram of the electric resistance versus applied magnetic field for a prior art spin-valve magnetic sensor
Figure 3:
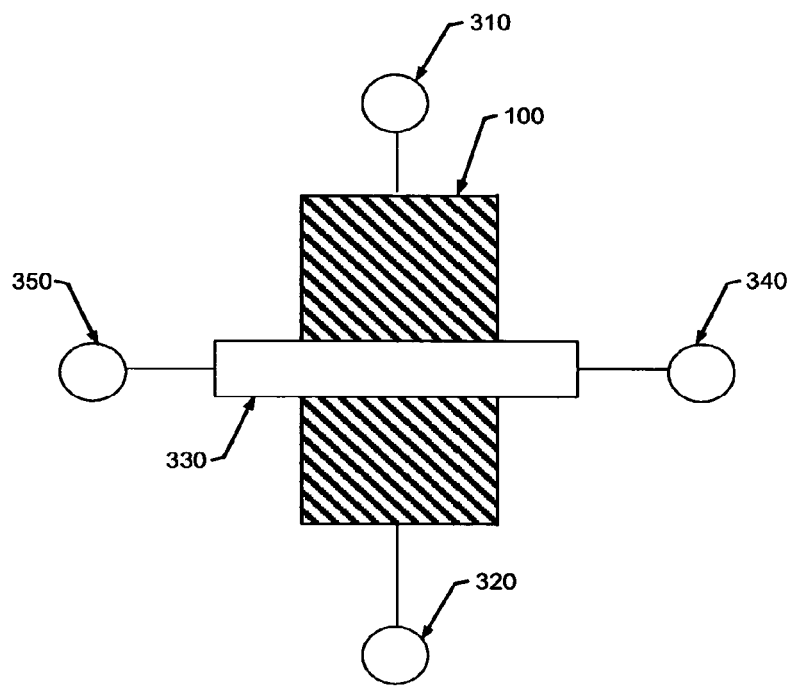
FIG. 3 is a schematic plan view of a prior art spin-valve magnetic memory element.
Figure 4:
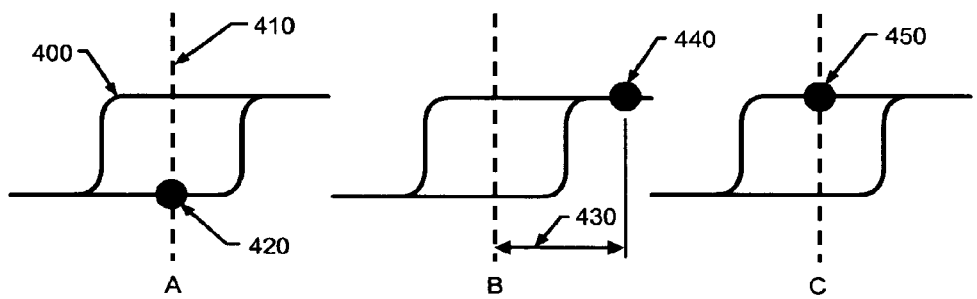
FIG. 4 is a diagram illustrating the method of changing the state of a spin-valve magnetic memory element

FIG. 2 is a graph of the electric resistance versus applied magnetic field for a spin-valve magnetic sensor. The resistance versus magnetic field plot 210 exhibits the hysteresis typical of magnetic devices. However, because of the asymmetric structure of the spin-valve device, the hysteresis is centered about a bias magnetic field indicated by dashed line 220. There are two stable values for the resistance in the presence of a suitable bias magnetic field, but only one value of resistance outside the suitable range of magnetic field. The combination of a spin-valve sensor and a means for providing a suitable bias magnetic field constitutes a magnetic memory element capable of "storing" one of two stable states that can be "read" by measuring the resistance of the conductive layer within the spin-valve device FIG. 3 is a schematic plan view of a prior art spin-valve magnetic memory element suitable for use in the invention. The spin-valve device 100 should be understood to be the top view of the stacked layers previously shown in cross-section in FIG. 1. Terminals 310, 320 connect to opposing ends of the non-magnetic layer 110 and can be used to measure the resistance of that layer. Terminals 340, 350 connect to opposing ends of conductor 330. Conductor 330 crosses over the spin-valve device 100 such that a sufficient electrical current passed through conductor 330 will create a magnetic field along the length of spin-valve 100 for the purpose of "writing" the state of the spin-valve memory. It should be understood that the memory element also comprises a means, not shown in FIG. 3, for providing the bias magnetic field required to maintain two stable states of the spin-valve device. In an actual spin-valve memory, terminals 310, 320, 340, 350 would be replaced by conductors connecting the circuitry required to read and write the memory content FIG. 4 is a diagram illustrating a method of changing the state of a spin-valve magnetic memory element. Curve 400 represents the hysteresis characteristic of the spin-valve device as previously discussed in conjunction with FIG. 2. In FIG. 4A, the spin-valve is in the low resistance state as indicated by point 420. This state is maintained by the presence of the bias magnetic field with a field strength indicated by dashed line 410. In FIG. 4B, the magnetic field has been changed by an amount indicated by arrow 430. This changed magnetic field has driven the spin valve to its high resistance state as indicated by point 440. In FIG. 4C, the magnetic field has been restored to the original value and the spin valve is maintained in the high resistance state as indicated by point 450. The spin valve can be "written" back to the low resistance state by changing the magnetic field in the opposing direction to the field used to write the high resistance state.

FIG. 3 and FIG. 4 are representative examples of the structure and operation of a magnetic memory element suitable for use in the invention. Magnetic memory elements and magnetic random access memories (MRAM) are well known in the art. U.S. Pat. No. 5,949,707, U.S. Pat. No. 5,966,322, U.S. Pat. No. 6,021,065, U.S. Pat. No. 6,275,411, and U.S. Pat. No. 6,349,053 all describe memory elements using spin-valve (or giant magneto restrictive effect) or spin-tunneling devices. Any magnetic memory device may be suitable for use in the invention so long as the device exhibits two stable states in the presence of a magnetic field having strength and direction falling within predetermined, finite, controllable limits.

Figure 5:
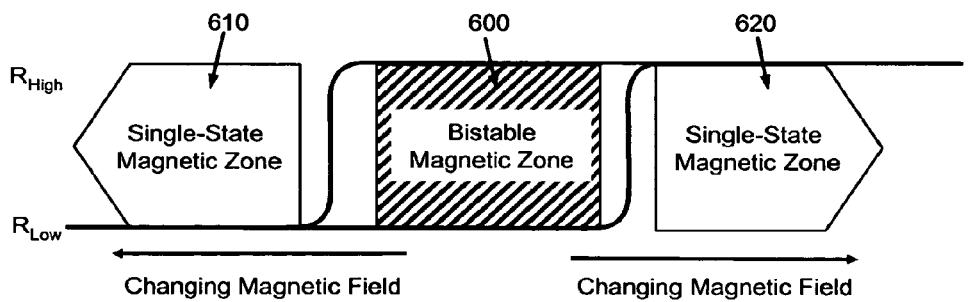
FIG. 5 is a diagram illustrating the operation of the invention

The invention leverages the magnetic memory element's hysteretic behavior. The interrelationship between a magnetic memory element's magnetic field surroundings (external magnetic field parameters at any given moment in time) and its electrical resistance (and the number of resistance values possible) is illustrated in FIG. 5.

In essence, the magnetic memory element's hysteresis notionally divides the magnetic field range into three zones: two single-state conditions 610, 620 and one "bistable" zone 600. The suitable zone represents the design level for the bias magnetic field plus margin for magnetic variations; two stable binary resistance values are possible in this zone. The field strength in the "bistable" zone may be centered about zero, or may be centered on a predetermined non-zero value. The single-state zones represent the external magnetic field direction and strength caused by intrusion events; one and only one resistance value is possible in each of these zones.

In practice, an intrusion detection sensor will contain a minimum of two magnetic memory elements. Upon hardware initialization, predetermined resistance values can be written to individual spin valves to store a binary resistance security code or encryption key. In the case where the memory has only two elements and can only store two binary bits, the possible useful security code values are 01 and 10 (either the high or low resistance states can be arbitrarily defined as binary 0). This code will persist if, and only if, the applied magnetic field for all spin valves is maintained in the bistable zone. If at any time the applied magnetic field changes into either of the single-state zones, the security code is erased (either all "0s" or all "1s" depending on which of the two intrusion zones was applied last). The change in the stored security code will occur whether or not power is applied.

Figure 6A:
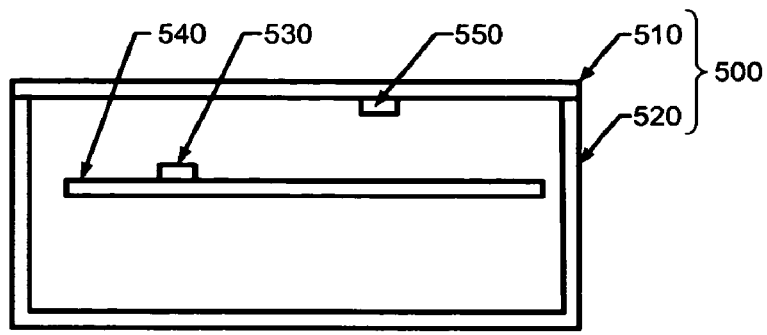
FIGS. 6A, 6B, 6C, and 6D are schematic cross-sectional views of embodiments of the invention.

FIG. 6A is a schematic cross-sectional view of an exemplary embodiment of the invention. Enclosure 500, comprised of a box 520 and a cover 510, encloses electronic equipment 540, which must be protected from intrusion or unauthorized access. Magnetic memory array 530, comprised of two or more spin-valve or other magnetic memory elements, is disposed within the enclosure as part of electronic equipment 540. A means for providing a magnetic field 550, such as a permanent magnet, is disposed on and permanently attached to the cover 510. The means for providing a magnetic field 550 is designed and positioned to create the desired bias magnetic field (required for magnetic memory operation) at the magnetic memory array 530. Thus the magnetic memory array 530 can stably store a security code so long as the cover 510 is in place and the magnetic field at the memory array is within the bistable zone. Any motion of the cover 510 with respect to the memory array 530 (such as would occur during disassembly of enclosure 500) will change the magnetic field at the memory array into either of the "single-state" zones and permanently erase the security code stored therein.

Figure 6B:
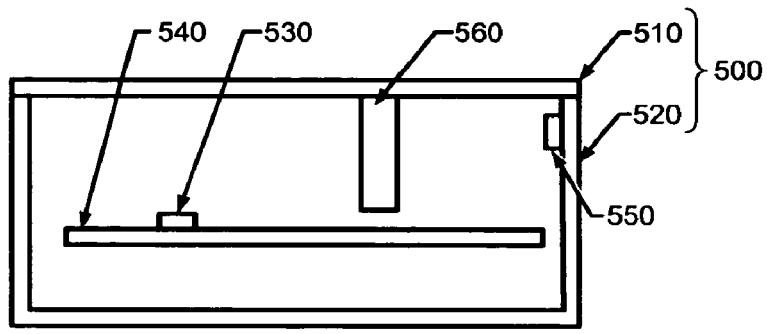
Figure 6C:
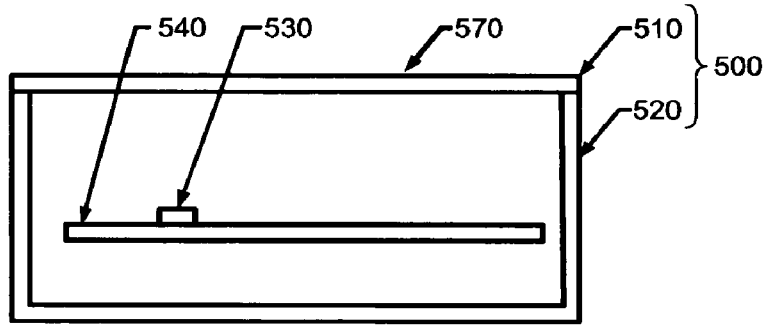
Figure 6D:
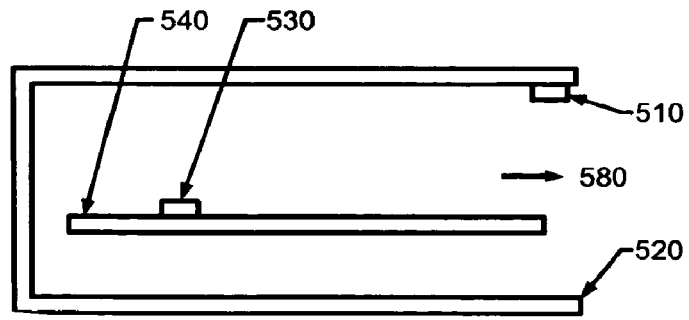

FIGS. 6B, 6C, 6D are schematic cross-sectional views of additional exemplary embodiments of the invention. Like elements have the same reference designators used in FIG. 6A.

In FIG. 6B, a magnetic shield 560 attached to cover 510 is disposed between the magnetic memory array 530 and magnet 550. Removing cover 510 displaces the shield 560, changing the magnetic field at memory array 530 and thus changing the security code stored therein.

In FIG. 6C, the magnetic memory array 530 is adapted to stably store a security code in the absence of a magnetic field, and cover 510 and box 520 are constructed of a magnetic shielding material. Removing cover 510 exposes the magnetic memory array 530 to environmental magnetic fields, depicted by arrow 570, thus changing the security code stored in the magnetic memory array.

In FIG. 6D, electronic equipment 540 bearing magnetic memory array 530 is disposed within box 520 and can only be removed by motion in the direction indicated by the arrow 580. Electronic equipment 540 could be a circuit card or module conventionally mounted in card guides. Removing electronic equipment 540 in direction 580 causes the magnetic memory array 530 to pass in proximity to magnetic 550, thus changing the content stored in memory array 530.

It should be understood that FIGS. 6A, 6B, 6C, and 6D illustrate simplistic embodiments of the invention and that many variations are possible within the scope of the invention. The magnetic memory array and the means for providing a magnetic field may be disposed anywhere within the enclosure so long as attempted intrusion results in relative motion between these elements. This relative motion could be caused by removing a cover, opening a drawer or door, or sliding a circuit module from a rack. Additionally, multiple memory arrays, magnets, or shields could be disposed such that intrusion is detected by relative motion of at least one memory array with respect to at least one magnet or one shield.

Figure 7A:
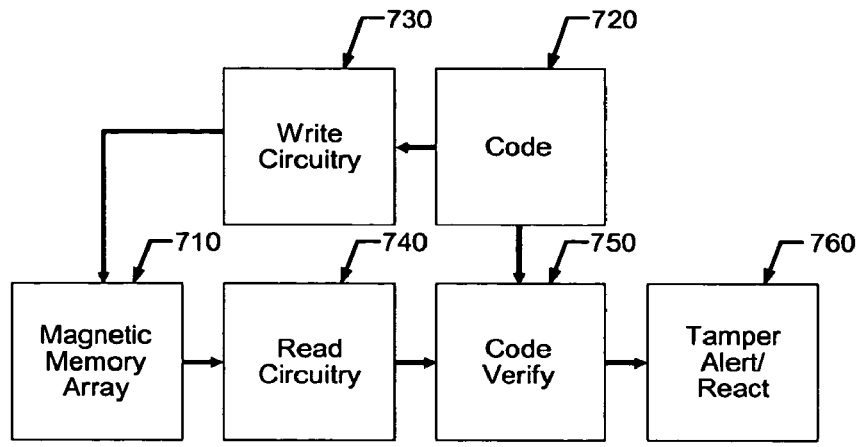
FIGS. 7A, 7B are block diagrams of embodiments of the invention

FIG. 7A is a block diagram of a further embodiment of the invention, which is comprised of a magnetic memory array 710 including means (not illustrated) for establishing a suitable bias magnetic field, circuitry for writing 730 and reading 740 the magnetic memory content, means for establishing 720 and verifying 750 a security code, and means 760 for reacting to an intrusion event if detected. The security code can be established by a variety of means 720, including permanently storing the code in a memory, generating the code through some random process, or acquiring the code from an external source via a secure datalink. Once the code is established, the write circuitry 730 copies the code into magnetic memory array 710 by sending pulses of electrical current through the write conductors of the magnetic memory elements. Note that the code can only be written into the magnetic memory array in the presence of the appropriate bias magnetic field. So long as the bias magnetic field is maintained, the security code is stored in magnetic memory 710 and can be read by read electronics 740. In typical applications, the code will be read periodically and verified by comparison with the pre-established security code. Any change in the code will activate the means 760 for reacting to the intrusion event, which may range from a simple alarm to self-destruction of the functionality of the protected equipment (by means of erasure of internal firmware, for example).

While read circuitry 740 will most likely be located in the immediate proximity of magnetic memory array 710, the other elements shown in FIG. 7 do not need to be located within the protected enclosure. For example, the write circuitry could be external to the enclosure and connected to the magnetic memory array only temporarily to write the security code after the enclosure is assembled. Any or all of the means for establishing the security code 720, the means for verifying the code 750, and the means for reacting to an intrusion event 760 could be located within the protected enclosure or could be external to the protected enclosure and connected by a secure data link.

Figure 7B:
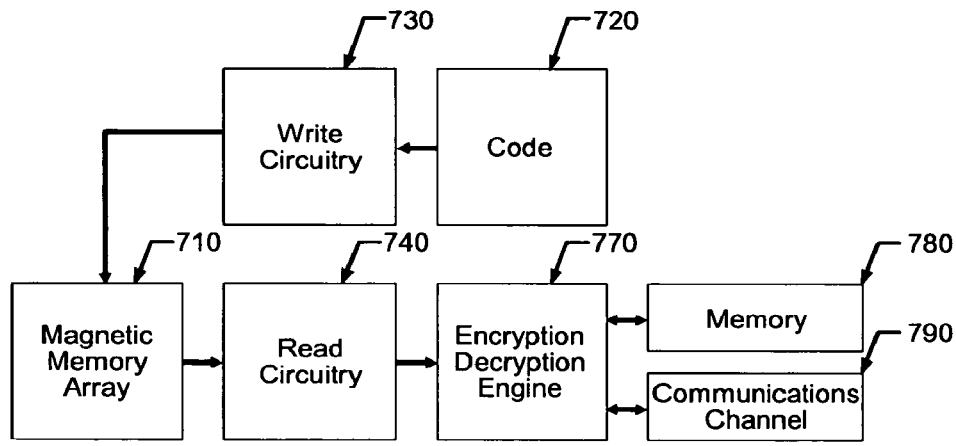

FIG. 7B is a block diagram of a preferred embodiment of the invention. As previously described, means 720 establish a security code that is stored in magnetic memory array 710 by write circuitry 730. The stored security code is read from magnetic memory array 710 by read circuitry 740 and provided to encryption/decryption engine 770. Encryption/decryption engine 770 uses the security code as an encryption key to encrypt or decrypt information to be stored in or read from memory 780, or information to be transmitted or received via communications channel 790. Requiring the read circuitry 740 to read the content of magnetic memory 710 every time an encryption or decryption operation is performed will ensure that loss of the magnetic memory content causes immediate loss of function of the protected equipment.

Description of Processes

Figure 8:
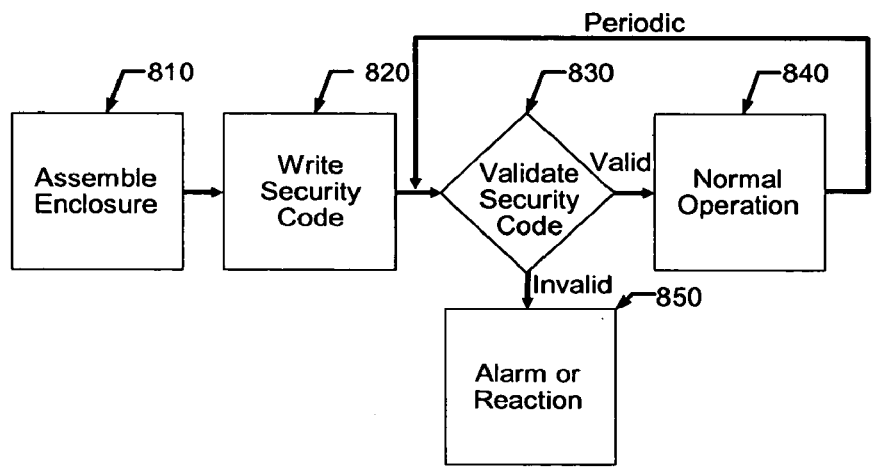
FIG. 8 is a flow chart of the process of using the invention.

FIG. 8 illustrates the process of using the invention. After the enclosure is assembled at step 810, the security code is written into the magnetic memory array at step 820. The code read from the memory is validated at step 830. The step of validating the security code may be accomplished by comparing the code to a known value, or by using the code to decrypt data previously encrypted using the same code. The protected electronic equipment operates normally 840 if the security code is valid, and reacts in some predetermined manner 850 if the code is invalid. The security code is revalidated periodically, either at fixed time intervals, every time an encryption or decryption operation is performed, or after some event, such as every time power is applied to the protected electronics.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

For means-plus-function limitations recited in the claims, the means are not intended to be limited to the means disclosed herein for performing the recited function, but are intended to cover in scope any means, known now or later developed, for performing the recited function.

As used herein, "plurality" means two or more.

As used herein, a "set" of items may include one or more of such items.

As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

As used herein, "and/or" means that the listed items are alternatives, but the alternatives also include any combination of the listed items.

It is claimed:

1. An intrusion-resistant apparatus, comprising:
   an enclosure;
   a magnetic memory array disposed with the enclosure, the magnetic memory comprising a plurality of magnetic memory elements, each adapted to store a binary value only in the presence of a predetermined bias magnetic field having a magnetic field strength and direction within predetermined limits;
   means for providing the predetermined bias magnetic field disposed within the enclosure;
   at least one magnetic shielding element disposed between the magnetic memory array and the means for providing the predetermined bias magnetic field; and
   an encryption/decryption engine disposed with the enclosure, the encryption/decryption engine to encrypt and decrypt data based on an encryption/decryption key stored in the magnetic memory array, wherein the means for providing the predetermined bias magnetic field comprises the at least one magnetic shielding element.

2. The intrusion-resistant apparatus of claim 1, wherein said magnetic memory array and the means for providing the predetermined bias magnetic field are disposed such that any attempt to intrude into the enclosure alters the bias magnetic field sufficiently to change at least one of the binary values stored in the memory array.

3. The intrusion-resistant apparatus of claim 1, wherein the magnetic memory elements comprise one of spin-valve devices and spin-tunneling devices.

4. The intrusion-resistant apparatus of claim 1, wherein the means for providing the predetermined bias magnetic field comprises at least one permanent magnet.

5. The intrusion-resistant apparatus of claim 4, wherein the means for providing the predetermined bias magnetic field comprises a plurality of permanent magnets.

6. The intrusion-resistant apparatus of claim 4, wherein the magnetic memory array and the at least one permanent magnet are disposed such that any attempt to intrude into said enclosure causes relative motion between the magnetic memory array and the at least one permanent magnet.

7. The intrusion-resistant apparatus of claim 1, wherein the magnetic memory array and the at least one magnetic shielding element are disposed such that any attempt to intrude into said enclosure causes relative motion between the magnetic memory array and the at least one magnetic shielding element.

8. The intrusion-resistant apparatus of claim 1, further comprising:
   write circuitry for storing the encryption/decryption key in the magnetic memory array; and
   read circuitry for reading the stored encryption/decryption key.

9. The intrusion-resistant apparatus of claim 8, wherein the read circuitry reads the stored encryption/decryption key each time the encryption/decryption engine encrypts or decrypts data.

10. The intrusion-resistant apparatus of claim 1, further comprising:
    a memory,
    wherein the encryption/decryption engine encrypts data to be stored in the memory and decrypts data read from the memory.

11. The intrusion-resistant apparatus of claim 1, further comprising:
    a communication channel,
    wherein the encryption/decryption engine encrypts data to be transmitted via the communication channel and decrypts data received via the communication channel.

12. A method of protecting an electronic apparatus from intrusion, comprising:
    storing an encryption/decryption key in a magnetic memory array including a plurality of magnetic memory elements, each magnetic memory element adapted to store a binary value only in the presence of a predetermined bias magnetic field having a magnetic field strength and direction within predetermined limits;
    shielding the magnetic memory array from external magnetic fields by disposing at least one magnetic shielding element between the magnetic memory array and a permanent magnet arranged to provide the predetermined bias magnetic field; and
    encrypting and decrypting data using the encryption/decryption key stored in the magnetic memory array, wherein said magnetic memory array is disposed within an enclosure such that any attempt to intrude into the enclosure alters the bias magnetic field sufficiently to change at least one of the binary values stored in the memory array, and wherein the predetermined bias magnetic field is provided by at least one of a permanent magnet and the at least one magnetic shielding element.

13. The method of protecting an electronic apparatus of claim 12, wherein the magnetic memory elements are one of spin-valve devices and spin-tunneling devices.

14. The method of protecting an electronic apparatus of claim 12, further comprising:
    reading the stored encryption/decryption key from the magnetic memory array.

15. The method of protecting an electronic apparatus of claim 14, wherein the stored encryption/decryption key is read each time data is encrypted or decrypted.

16. The method of protecting an electronic apparatus of claim 12, further comprising at least one of:
    encrypting data to be stored in a memory disposed within the enclosure; and
    decrypting data read from the memory.

17. The method of protecting an electronic apparatus of claim 12, further comprising at least one of:
    encrypting data to be transmitted via a communication channel; and
    decrypting data received via the communication channel.

* * * * *

UNITED STATES PATENT AND TRADEMARK OFFICE
CERTIFICATE OF CORRECTION

| | | |
|---|---|---|
| PATENT NO. | : 8,167,057 B2 | Page 1 of 1 |
| APPLICATION NO. | : 12/136634 | |
| DATED | : May 1, 2012 | |
| INVENTOR(S) | : Stephen A. Gabelich | |

It is certified that error appears in the above-identified patent and that said Letters Patent is hereby corrected as shown below:

On Sheet 4 of 4, Box 770, Figure 7B, lines 1-2, delete "Encryption Decryption" and insert -- Encryption/Decryption --, therefor.

In column 2, line 11, after "devices" insert -- . --.

In column 2, line 18, after "disassembled" insert -- . --.

In column 2, line 31, after "sensor" insert -- . --.

In column 2, line 33, after "sensor" insert -- . --.

In column 2, line 37, after "element" insert -- . --.

In column 2, line 38-39, after "invention" insert -- . --.

In column 2, line 43, after "invention" insert -- . --.

In column 3, line 13, after "device" insert -- . --.

In column 3, line 37, after "110" insert -- . --.

In column 3, line 51, after "device" insert -- . --.

In column 4, line 2, after "content" insert -- . --.

Signed and Sealed this
Tenth Day of July, 2012

David J. Kappos
*Director of the United States Patent and Trademark Office*